*(12)* United States Patent
Damlencourt et al.

(10) Patent No.: US 7,648,893 B2
(45) Date of Patent: Jan. 19, 2010

(54) METHOD FOR MANUFACTURING A SEMICONDUCTOR-ON-INSULATOR SUBSTRATE FOR MICROELECTRONICS AND OPTOELECTRONICS

(75) Inventors: Jean-Francois Damlencourt, Laval (FR); Laurent Clavelier, Grenoble (FR)

(73) Assignee: Commissariat A l'Energie Atomique, Paris (FR)

( * ) Notice: Subject to any disclaimer, the term of this patent is extended or adjusted under 35 U.S.C. 154(b) by 0 days.

(21) Appl. No.: 12/144,992

(22) Filed: Jun. 24, 2008

(65) Prior Publication Data

US 2009/0017602 A1    Jan. 15, 2009

(30) Foreign Application Priority Data

Jul. 11, 2007    (FR) .................................. 07 56418

(51) Int. Cl.
*H01L 21/36* (2006.01)
(52) U.S. Cl. .................. 438/481; 438/41; 438/222; 438/226; 438/369; 438/341; 257/E21.132; 257/E21.133; 257/E21.562; 257/E21.009; 257/E21.102
(58) Field of Classification Search ................. 438/459, 438/478, 479, 483; 257/18, 112, 157, E21.112, 257/567, 633, E29.004, 279; 117/43
See application file for complete search history.

(56) References Cited

U.S. PATENT DOCUMENTS

| 2005/0116290 | A1 | 6/2005 | de Souza et al. |
| 2006/0076622 | A1* | 4/2006 | Wang et al. .................. 257/347 |
| 2006/0157706 | A1 | 7/2006 | Zhu et al. |
| 2007/0246702 | A1* | 10/2007 | Andrieu et al. ................ 257/18 |
| 2008/0135886 | A1* | 6/2008 | Irisawa et al. ................ 257/255 |

* cited by examiner

*Primary Examiner*—Charles D Garber
*Assistant Examiner*—Yasser A Abdelaziez
(74) *Attorney, Agent, or Firm*—Oblon, Spivak, McClelland, Maier & Neustadt, L.L.P.

(57) ABSTRACT

A method for manufacturing a semiconductor including the steps of supplying a substrate having a support with one face supporting a strained silicon thin layer; forming a first mask on a portion of the strained silicon thin layer; epitaxy of $Si_{1-x}Ge_x$ on the portion of the layer not masked by the first mask; condensating germanium to obtain a strained germanium layer, the strained germanium layer then covered by a silicon oxide layer; eliminating the first mask and of the silicon oxide layer thereby exposing a semi-conducting thin layer; forming a second mask on the semi-conducting thin layer exposed via the previous step, the second mask protecting a region of the exposing a remaining strained germanium portion; epitaxial growing germanium on the remaining strained germanium portion; and removing the second mask.

7 Claims, 3 Drawing Sheets

METHOD FOR MANUFACTURING A SEMICONDUCTOR-ON-INSULATOR SUBSTRATE FOR MICROELECTRONICS AND OPTOELECTRONICS

TECHNICAL FIELD

The invention relates to a method for manufacturing a semiconductor-on-insulator for microelectronics and optoelectronics.

STATE OF THE PRIOR ART

Due to the ration of volume-related conditions between electrons and holes in silicon (1500 and 500 $cm^2/V/s$, respectively), the electrical characteristics of NMOS and PMOS transistors have imbalances, and PMOS transistors are much less efficient than NMOS transistors (in terms of current output and therefore speed). The co-integration of a silicon NMOS and a germanium PMOS on a single substrate is a means of improving the characteristics of the PMOS in a CMOS circuit but also of balancing the N and P transistors both in terms of both current level and in terms of time constants, and without any loss of available space. As a matter of fact, the volume mobility of the holes in germanium is of the order of 1900 $cm^2/V/s$, and that of the electrons in silicon is close to 1500 $cm^2/V/s$, thereby enabling the manufacture of N and P transistors having the same dimensions and almost the same static and dynamic electrical characteristics.

One of the techniques enabling this type of co-integration to be achieved is germanium condensation. This technique is based, on the one hand, on the total miscibility of germanium and silicon (which have the same crystalline structure), and, on the other hand, on the difference in chemical affinity between germanium and silicon, with regard to oxygen. Reference may be made to this subject in the article "Ultra-thin body SiGe-on-Insulator p-MOSFETS with high mobility SiGe surface channels," by T. TEZUKA et al., EDL 2002, Vol. 50, No. 5, pages 1328 to 1333, 2003.

The principle of germanium condensation of an SOI substrate will now be explained, e.g., a substrate comprising the superimposing of a silicon substrate, a buried silicon oxide layer and a thin silicon layer. An epitaxial SiGe layer is grown on the thin silicon layer. Oxidation of the structure thus obtained is induced. The thin silicon layer and the SiGe layer become germanium-enhanced during the oxidation process and, if this process is continued for a sufficiently long time period, a pure germanium layer is obtained on the buried oxide layer, the germanium layer being covered by a silicon oxide layer.

However, this condensation technique has a technological limitation because the silicon unit cell parameter is 4% smaller than that of germanium (the size of the unit cell varying quadratically in relation to the percentage of germanium in the SiGe). Thus, when the SiGe layer is grown epitaxially on the thin silicon layer of the SOI substrate, as long as the thickness of the SiGe layer is less than the critical plastic relaxation thickness, the SiGe layer is compressive-strained. Above this thickness, the SiGe begins to relax the strain stored by the creation of structural defects (dislocations, vacancies, . . . ). If condensation of the germanium from a defect-free substrate is desired, the thickness of the SiGe layer is limited by the critical plastic relaxation thickness. This limitation of the initial thickness of the SiGe layer influences the thickness of the final germanium layer. As a matter of fact, during the germanium condensation step, the total amount of germanium is preserved. For example, if germanium condensation is induced in a structure comprising a 100-nm SiGe layer with a 10% concentration of Ge on an SOI substrate, a pure 10-nm layer of germanium is ultimately obtained.

It is thus possible to obtain germanium-on-insulator layers devoid of any structural defects via the standard germanium condensation technique.

Furthermore, for semiconductor layers, a distinction is made in microelectronics between the strained layers and the relaxed layers. Any layer of a semiconductor material the crystallographic structure of which is tensile or compressive-strained during crystal growth, such as epitaxy, thereby modifying the crystal lattice in the direction of growth, is referred to as a "strained layer." Conversely, any layer of a semiconductor material which has a non-strained crystallographic structure, i.e., which has a unit cell parameter which is identical to the cubic unit cell parameter of the material of the layer, is referred to as a "relaxed layer." Strain such as this can provide a semiconductor material with advantageous electrical properties. Thus, for example, the primary interest in tensile-strained silicon layers consists primarily in that they have a greater current carrier mobility (such as holes and electrons) than that normally found in relaxed silicon layers.

In this regard, strained silicon layers can attain a 100% greater current carrier mobility than that present within relaxed silicon layers.

It is thus possible to anticipate a co-integration of high-performance electronic components and photonic components on a single semiconductor-on-insulator substrate. The problem is that of obtaining a strained silicon thin layer or sSOI ("strained Silicon-On-Insulator") for producing NMOS transistors thereon, a strained germanium thin layer or sGeOI ("strained Germanium-On-Insulator") for producing PMOS transistors thereon, and a germanium thick layer intended for photonic components.

When dealing with a semiconductor-on-insulator substrate comprising strained sSOI regions and strained sGeOI regions, it would thus be necessary to thicken a strained sGeOI region in order to obtain a germanium thick layer intended for photonic components. However, in this case, the critical plastic relaxation thickness of the germanium would be exceeded on the sGeOI and structural defects would be created in the germanium layer. These structural defects, e.g., emerging dislocations (defects which pass through the thickness of the layer to emerge at the surface), are very detrimental to mobility in electronic components and also to light in photonic components.

SUMMARY OF THE INVENTION

This invention was designed to remedy the disadvantages of the prior art. It enables the co-integration of electronic and photonic components on a single substrate. This enables the following advantages to be obtained. The possibility of producing these components on a semiconductor-on-insulator substrate enables perfect electrostatic control of the components. It is possible to produce NMOS transistors on SOI and PMOS transistors on GeOI. The invention enables mechanical strain to be maintained:tensile strain for the NMOS and compressive strain for the PMOS, these strains producing a substantial gain in mobility. The invention makes it possible to co-integrate photonic components on Ge thick layers of high crystalline quality.

According to this invention, it is proposed to co-integrate thin-layer Si and Ge and thick-layer Ge from an sSOI substrate having particular <110> or <111> orientations.

Therefore, the subject matter of the invention is a method for manufacturing a semiconductor-on-insulator substrate for microelectronics and optoelectronics, comprising the following steps:

supplying a substrate comprising a support having one face made of a dielectric material supporting a strained silicon thin layer having a <110> or <111> orientation, formation of a first mask on a portion of the strained silicon thin layer, epitaxy of $Si_{1-x}Ge_x$ on the portion of the layer not masked by the first mask, high-temperature oxidation, according to the germanium condensation technique, until a strained germanium layer is obtained, which rests on the face of the support made of a dielectric material, the strained germanium layer then being covered by a silicon oxide layer, elimination of the first mask and of the silicon oxide layer, thereby exposing a semi-conducting thin layer comprising said strained silicon portion and a remaining strained germanium portion, formation of a second mask on said semi-conducting thin layer exposed via the previous step, the second mask protecting a region of the remaining strained germanium portion and at least one region of the strained silicon portion, the second mask exposing a remaining strained germanium portion, epitaxial growth of germanium on the remaining strained germanium portion, in order to obtain a germanium thick layer, elimination of the second mask.

During the step for epitaxial growth of germanium, the germanium relaxes, however, since the substrate has an appropriate orientation, the dislocations remain confined to the interface between the germanium thick layer and the face of the support made of a dielectric material. The absence of dislocations yields a good-quality material for optoelectronic components, it being assumed that the presence of dislocations at said interface is non-impeding.

The dielectric material of the support is preferably a material chosen from $SiO_2$, $Si_3N_4$ and $Al_2O_3$.

The step of supplying a substrate can include:

epitaxial growth of a thick, that is relaxed, SiGe layer on a initial silicon substrate having a <110> or <111> orientation, epitaxial growth of said strained silicon thin layer from the SiGe thick layer, formation of a silicon oxide layer on said strained silicon thin layer, bonding of a handle substrate to the free face of the silicon oxide layer, separation of the resulting structure in order to eliminate the portion of the structure comprising the initial substrate and the SiGe thick layer.

In this case, provisions can be made for an ion implantation step, prior to the handle substrate bonding step, (e.g., hydrogen implantation, in accordance with the Smartcut™ process) in the SiGe thick layer, in order to produce an embrittled layer therein, the separation step then comprising a step for cleaving the structure in the area of the embrittled layer and a step for removing the SiGe remaining on the strained silicon thin layer. The cleaving step can include a heat treatment of the embrittled layer. An sSOI substrate is thereby obtained the active membrane of which has a <110> or <111> orientation, depending on whether the initial substrate has a <110> or <111> orientation.

The first mask can include a silicon oxide layer formed on the strained silicon thin layer and covered with a silicon nitride layer.

The second mask can include a silicon nitride layer formed on said semi-conducting thin layer.

BRIEF DESCRIPTION OF THE DRAWINGS

The invention will be better understood and other advantages and characteristics will become apparent upon reading the following description, given for non-limiting illustrative purposes, and accompanied by the appended drawings, in which.

DETAILED DISCLOSURE OF PARTICULAR EMBODIMENTS

The manufacturing method according to the invention first comprises a step for supplying a substrate comprising a support having one face made of a dielectric material supporting a strained silicon thin layer having a <110> or <111> orientation. In the following example, the strained silicon thin layer has a <111> orientation.

FIGS. 1A to 1F show a step for supplying a substrate comprising a support having one face made of a dielectric material supporting a strained silicon thin layer having a <111> orientation.

Figure 1A:
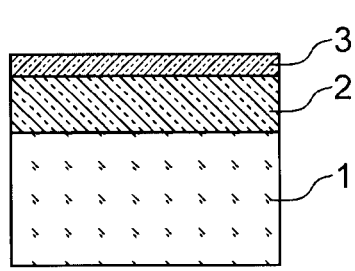
FIGS. 1A to 1F show the step of supplying a substrate comprising a support having one face made of a dielectric material supporting a strained silicon thing layer, according to one embodiment of the invention.

FIG. 1A shows an initial silicon substrate with a <111> orientation successively supporting a SiGe thick layer 2 and a tensile-strained silicon thin layer 3.

The thick layer 2 is a relaxed layer obtained via epitaxy. The thickness thereof, for example, is at least 1 µm. The deposition of this layer is made over a layer referred to as a virtual substrate. During formation of this virtual substrate, the concentration of Ge is gradually increased, linearly or in spurts, until the desired concentration is obtained.

Next, via epitaxy still, the silicon layer 3 is deposited, with a thickness less than the critical relaxation thickness of the strained portions. For example, the thickness of the strained silicon layer 3 may be a few tens of nanometers. The value of the critical plastic relaxation thickness of the silicon layer depends on the germanium concentration of the SiGe thick film: e.g., Hc<30 nm deposited on a layer of $Si_{0.7}Ge_{0.3}$.

Its orientation reproduces the <111> orientation of the substrate 1. If, for example, the silicon layer is made on a face of the relaxed SiGe layer having a Ge composition equal to 20%, the Si layer will have a surface unit cell parameter equivalent to that of an 20% SiGe alloy. This will then be a 20% <111> sSOI substrate.

Figure 1B:
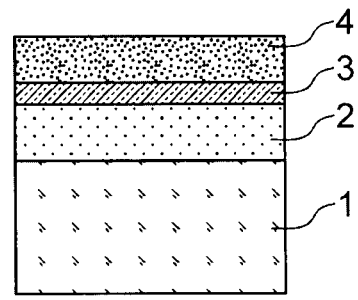
Figure 1C:
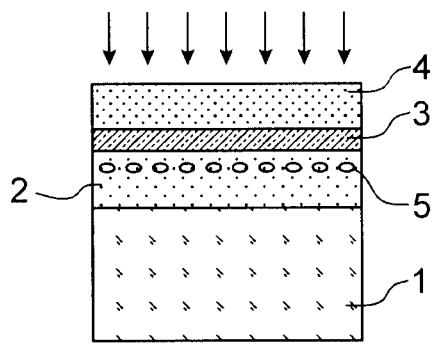

Next, the strained silicon layer 3 is thermally oxidized in order to obtain a silicon oxide layer 4 (see FIG. 1B). The oxide layer 4 can also be obtained via LPCVD deposition or via another method. For example, the thickness of the oxide layer 4 is 10 to 300 nm.

An ion implantation step is then carried out in accordance with the SmartCut™ process disclosed, in particular, in the document U.S. Pat. No. 5,374,564.The implanted ions, for example, are hydrogen ions. The implantation conditions, for example, are those mentioned in the document FR-A-2 681 472 (corresponding to the patent U.S. Pat. No. 5,374,564). The arrows drawn in FIG. 1C indicate the direction of implantation. A layer 5 of microcavities is obtained in the SiGe layer 2.

Figure 1D:
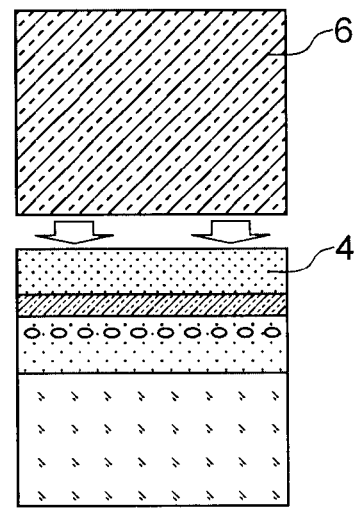
Figure 1E:
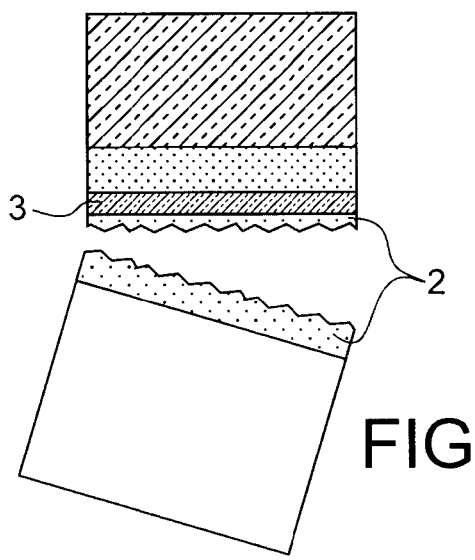

The structure obtained at the completion of step 1C is bonded onto a handle substrate. FIG. 1D shows a handle substrate 6 being bonded onto the free face of the oxide layer 4. Bonding can be obtained via molecular adhesion (or "wafer bonding"). The adhesion can be improved by a heat treatment, e.g., at a temperature of 600° C. for 1 hour.

The SiGe layer 3 is then cleaved in the area of the layer of microcavities 5. Cleavage (see FIG. 1E) can be obtained by means of a heat treatment. Next, the portion of the SiGe layer 2 still attached to the strained Si thin layer 3 is removed, e.g., via chemical etching known as HPA (HF/peroxygen/acetic acid) or HNA (HF/nitric acid/acetic acid).

Figure 1F:
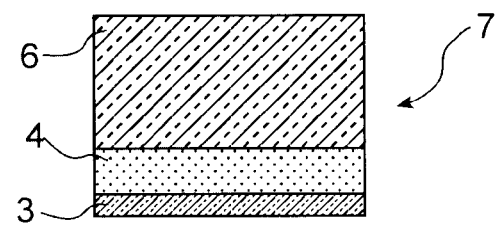

The structure (or substrate) shown in FIG. 1F is then obtained. The substrate 7 includes a support consisting of the handle substrate 6 successively supporting the oxide layer 4 (or buried layer) and the strained silicon thin layer 3.

FIG. 2A to 2F show a process for manufacturing a semiconductor-on-insulator substrate according to this invention.

Figure 2A:
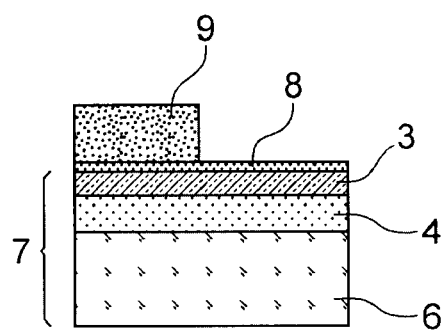
FIGS. 2A to 2F show a method for manufacturing a semiconductor-on-insulator substrate according to this invention.

FIG. 2A shows the previously obtained structure 7 over which a first mask is being formed. In order to form this first mask, a protective silicon oxide layer 8 is first formed, which, for example, is deposited via LPCVD, and which has a thickness of between 3 and 20 nm, and then a silicon nitride layer is formed, which, for example, is deposited via LPCVD or PECVD, and which has a thickness of between 50 and 500 nm. Photolithography is then carried out on the silicon nitride layer, and then the etching thereof in order to obtain the pattern referenced as 9 in FIG. 2A.

The silicon nitride pattern 9 exposes a portion of the silicon oxide layer 8. The exposed portion of layer 8 is then removed via wet chemical etching (diluted HF), for example, in order to leave a silicon oxide pattern 14 exposed.

Figure 2B:
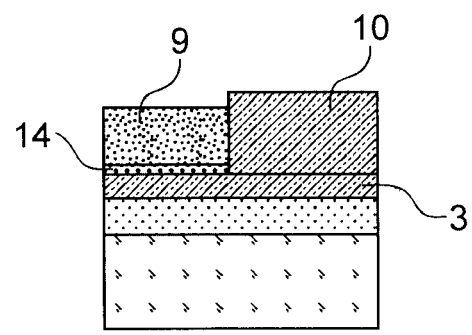
Figure 2C:
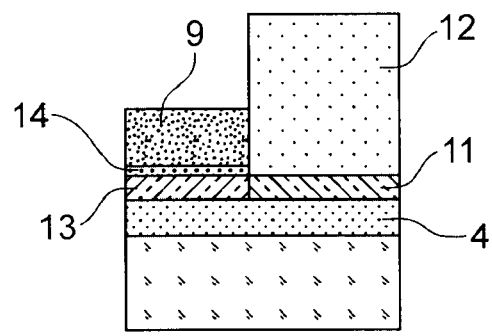
Figure 2D:
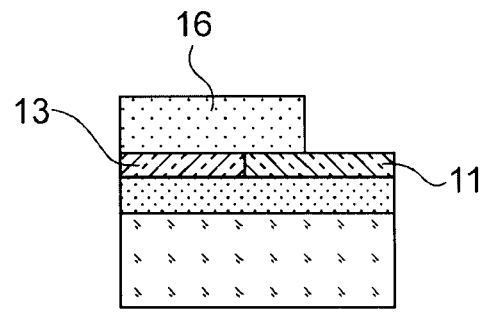
Figure 2E:
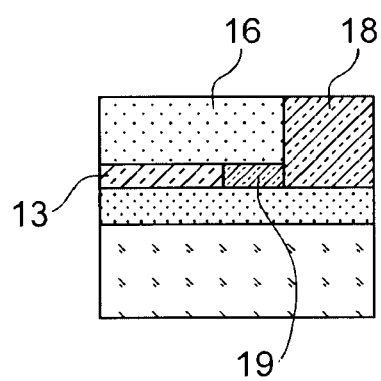

From the strained silicon layer 3, a tensile-strained SiGe layer 10 is then formed via epitaxy, which has a <111> orientation like layer 3 (see FIG. 2B). The strain percentage of layer 10 depends on the surface unit cell parameter of the strained silicon layer 3 and on the composition of the SiGe layer 10. For example, a layer 10 of $Si_{0.9}Ge_{0.1}$ can be deposited on a 20% sSOI-type substrate 7 (a surface unit cell parameter equivalent to that of an $Si_{0.8}Ge_{0.2}$ alloy). The equivalent tensile strain will then be equivalent to a unit cell parameter difference of 0.4%).

High-temperature oxidation is then carried out, using the germanium condensation technique, until a strained germanium layer 11 is obtained, which rests on the buried oxide layer 4. The strained germanium layer 11 is then covered with a silicon oxide layer 12 (see FIG. 2C). Over the course of this germanium condensation, the $Si_{1-x}Ge_x$ layer 10 changes from being tensile-strained to being compressive-strained. It is to be noted that where x is equal to the strain percentage of the starting sSOI, the $Si_{1-x}Ge_x$ layer then has no mechanical strain.

A composite substrate is finally obtained, comprising, on the buried oxide layer 4, a <111>, tensile-strained silicon layer 13 adjacent to a <111>, compressive-strained germanium layer 11. Layers 11 and 13 are suitable for the fabrication of CMOS transistors: NMOS transistors on the strained silicon layer 13 and PMOS transistors on the strained germanium layer 11.

In order to integrate, on a single substrate, a Ge layer suitable for the fabrication of photonic components, it is necessary to resume epitaxial growth of germanium on a portion of the strained germanium layer 11.

The silicon nitride pattern 9 and the silicon oxide pattern 14 are then removed, for example, via wet chemical etching: $H_3PO_4$ for the nitride and HF for the oxide.

After having removed the first mask, the second mask is formed. To accomplish this, a silicon nitride layer is formed, having a thickness of 50 nm, for example. Next, photolithography is carried out on the silicon nitride layer, and then the etching thereof in order to obtain the pattern referenced as 16 in FIG. 2D. The silicon nitride pattern 16 exposes a portion of the strained germanium layer 11.

Figure 3:
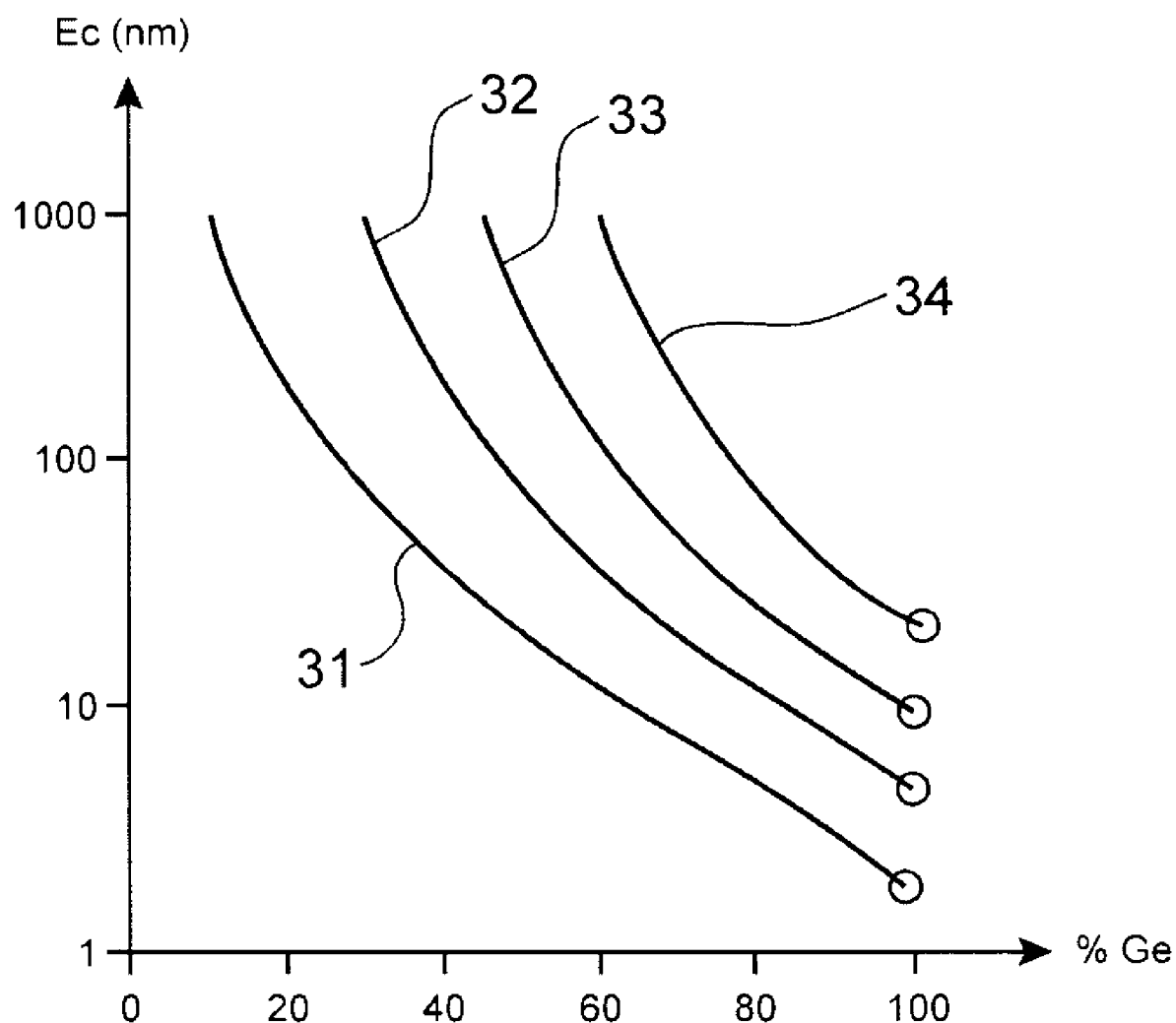
FIG. 3 shows a graph of the critical plastic relaxation thickness for the epitaxial growth of a silicon and germanium alloy, in relation to the percentage of germanium in the alloy and in relation to the deposition substrate.

A germanium layer 18 is then formed via epitaxy (see FIG. 2E), from the exposed region of the strained germanium layer 11, layer 18 encompassing layer 11. In this case, the mechanical strain is not maintained. The critical plastic relaxation thickness Ec shown in FIG. 3 is exceeded, (this critical thickness is indicated by circles in FIG. 3) will be described later in relation to the initial strain associated with the starting <111> sSOI, and expressed with regard to the surface unit cell parameter equivalent to an x % SiGe alloy. Structural defects are then created in layer 18. However, by using a disoriented <111> substrate, the defects are confined to the <111> interface plane situated between the germanium layer 18 and the buried oxide layer 4, and in no way affect the optical properties of the resulting layer.

Due to technological constraints (thickness of the strained GeOI layer), epitaxy is carried out at a low temperature (e.g., about 400° C.) and the final thickness of the germanium thick layer (for photonic components) is of the order of a few tens of nm, ideally 400 nm.

By forming the germanium layer 18, a strained germanium layer 19 is left remaining, which is intended for the fabrication of MOS transistors. Layer 19 has a thickness of less than 70 nm.

Figure 2F:
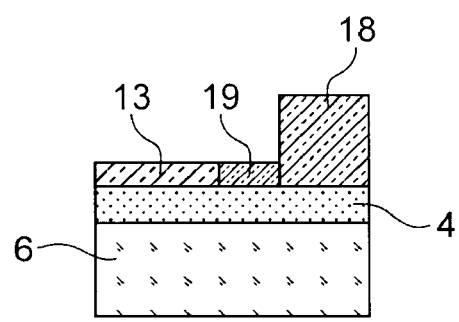

FIG. 2F shows the structure ultimately obtained and consisting of a silicon support 6 supporting a buried oxide layer 4 and a semiconductor-on-insulator layer consisting of adjacent portions: a strained silicon thin layer 13, a strained germanium thin layer 19 and a relaxed germanium thin layer 18.

FIG. 3 shows a graph of the critical plastic thickness for the epitaxial growth of a silicon and germanium alloy, in relation to the percentage of germanium in the alloy and in relation to the starting substrate.

In FIG. 3, curve 31 represents the critical thickness curve of $Si_{1-x}Ge_x$ on unstrained silicon on insulator (SOI), curve 32 represents the critical thickness curve of $Si_{1-x}Ge_x$ on strained 20% sSOI silicon, curve 33 represents the critical thickness of $S_{1-x}Ge_x$ on strained 35% sSOI silicon, and curve 34 represents the critical thickness curve of $Si_{1-x}Ge_x$ on strained 50% sSOI silicon.

The invention thus makes it possible to supply substrates comprising a semiconductor-on-insulator layer comprising a <111> sSOI region for the fabrication of NMOS transistors, a thin <111> sGeOI region for the fabrication of PMOS transistors, and a thick <111> GeOI region for the fabrication of photodetectors.

The resumed epitaxial growth carried out on the sGeOI region and dedicated to photodetection can be a resumption of the epitaxial growth of pure Ge or alternating depositions of doped, n, p or non-intentionally doped (nid) Ge, in order to produce a PIN structure.

The use of <110> and <111> surfaces also offers other advantages:
  improvement in the high dielectric constant Ge/oxide interface properties during the fabrication of transistors,
  improvement in the carrier (hole) mobility properties, confinement of the dislocations to the <111> interface plane when the critical relaxation thickness has been exceeded.

The invention claimed is:

1. A method for manufacturing a semiconductor-on-insulator substrate for at least one of microelectronics and optoelectronics, comprising the steps of:
   supplying a substrate comprising a support having one face made of a dielectric material supporting a strained silicon thin layer having a <110> or <111> orientation;
   forming a first mask on a portion of the strained silicon thin layer;
   epitaxy of $Si_{1-x}Ge_x$ on a portion of the layer not masked by the first mask;
   high-temperature oxidating, according to a germanium condensation technique, until a strained germanium layer is obtained, which rests on the face of the support made of a dielectric material, the strained germanium layer then being covered by a silicon oxide layer;
   eliminating the first mask and of the silicon oxide layer, thereby exposing a semi-conducting thin layer comprising said strained silicon portion and a remaining strained germanium portion;
   forming a second mask on said semi-conducting thin layer exposed via said step of eliminating, the second mask protecting a region of the remaining strained germanium portion and at least one region of the strained silicon portion, the second mask exposing a remaining strained germanium portion;
   epitaxial growing germanium on the remaining strained germanium portion, in order to obtain a germanium thick layer; and
   eliminating the second mask.

2. The method of claim 1, wherein the dielectric material of the support is a material chosen from at least one of $SiO_2$, $Si_3N_4$ and $Al_2O_3$.

3. The method as claimed in any of claims 1 or 2, wherein the step for supplying a substrate includes:
   epitaxial growing a thick, that is relaxed, SiGe layer on a initial silicon substrate having a <110> or <111> orientation;
   epitaxial growing said strained silicon thin layer from the SiGe thick layer;
   forming a silicon oxide layer on said strained silicon thin layer;
   bonding of a handle substrate to the free face of the silicon oxide layer; and
   separating the resulting structure in order to eliminate the portion of the structure comprising the initial substrate and the SiGe thick layer.

4. The method of claim 3, wherein provisions are made for an ion implantation step, prior to the handle substrate bonding step, in the SiGe thick layer, in order to produce an embrittled layer therein, the separation step then comprising a step for cleaving the structure in the area of the embrittled layer and a step for removing the SiGe remaining on the strained silicon thin layer.

5. The method of claim 4, wherein the cleaving step includes a heat treatment of the embrittled layer.

6. The method as claimed in claim 1, wherein the first mask includes a silicon oxide layer formed on the strained silicon thin layer and covered with a silicon nitride layer.

7. The method as claimed in claim 1, wherein the second mask includes a silicon nitride layer.

* * * * *